United States Patent
Rastogi et al.

(10) Patent No.: US 9,666,447 B2
(45) Date of Patent: May 30, 2017

(54) METHOD FOR SELECTIVITY ENHANCEMENT DURING DRY PLASMA ETCHING

(71) Applicant: Tokyo Electron Limited, Minato-ku, Tokyo (JP)

(72) Inventors: Vinayak Rastogi, Albany, NY (US); Alok Ranjan, Mechanicville, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/920,414

(22) Filed: Oct. 22, 2015

(65) Prior Publication Data

US 2016/0118256 A1 Apr. 28, 2016

Related U.S. Application Data

(60) Provisional application No. 62/069,387, filed on Oct. 28, 2014.

(51) Int. Cl.
*H01L 21/311* (2006.01)
*H01L 21/033* (2006.01)

(52) U.S. Cl.
CPC .... *H01L 21/31138* (2013.01); *H01L 21/0337* (2013.01)

(58) Field of Classification Search
CPC ................................................. H01L 21/31138
See application file for complete search history.

(56) References Cited

U.S. PATENT DOCUMENTS

| | | | |
|---|---|---|---|
| 7,579,279 B2 | 8/2009 | Flake et al. | |
| 7,723,009 B2 | 5/2010 | Sandhu et al. | |
| 9,153,457 B2 * | 10/2015 | Chakrapani | ....... H01L 21/67103 |
| 2011/0165382 A1 * | 7/2011 | Gogolides | ............... B29C 59/14 |
| | | | 428/156 |

(Continued)

FOREIGN PATENT DOCUMENTS

| | | |
|---|---|---|
| KR | 10-2014-0043694 A | 4/2014 |
| KR | 10-2014-0062412 A | 5/2014 |
| KR | 10-2014-0067870 A | 6/2014 |

OTHER PUBLICATIONS

Translation of KR2014-0067870A reference.*

(Continued)

*Primary Examiner* — Duy Deo
(74) *Attorney, Agent, or Firm* — Rothwell, Figg, Ernst & Manbeck, P.C.

(57) ABSTRACT

A method of etching a layer on a substrate is described. The method includes disposing a substrate having a heterogeneous layer composed of a first material and a second material in a processing space of a plasma processing system, wherein the heterogeneous layer has an initial upper surface exposing the first material and the second material to a plasma environment in the processing space, and performing a modulated plasma etching process to selectively remove the first material at a rate greater than removing the second material. The modulated plasma etching process includes a modulation cycle that preferentially reacts an etchant with the first material during a first phase of the modulation cycle, and differentially adheres a passivant on the second material relative to the first material during a second phase of the modulation cycle.

23 Claims, 13 Drawing Sheets

(56) References Cited

U.S. PATENT DOCUMENTS

| 2013/0140272 A1* | 6/2013 | Koole ................ B81C 1/00031 |
| | | 216/38 |
| 2014/0091435 A1* | 4/2014 | Chan ................. B81C 1/00031 |
| | | 257/618 |
| 2014/0131839 A1 | 5/2014 | Chan et al. |
| 2014/0148016 A1 | 5/2014 | Kanazawa et al. |
| 2015/0200109 A1* | 7/2015 | Kong ................ H01L 21/31144 |
| | | 438/703 |

OTHER PUBLICATIONS

U.S. Appl. No. 13/830,859, ", Chemi-Epitaxy in Directed Self-Assembly Applications Using Photo-Decomposable Agents," filed Mar. 14, 2013.

U.S. Appl. No. 13/843,122, "Solvent Anneal Processing for Directed-Self Assembly Applications," filed Mar. 15, 2013.

U.S. Appl. No. 61/793,204, "Multi-Step Bake Apparatus and Method for Directed Self-Assembly Lithography Control," Mar. 15, 2013.

Notification of Examination Opinions mailed Oct. 14, 2016 in corresponding Taiwan Patent Application No. 104135324 (9 pages).

Office Action mailed Nov. 21, 2016 in corresponding Korean Patent Application No. 10-2015-0150180 (with an English translation) (11 pages).

* cited by examiner

METHOD FOR SELECTIVITY ENHANCEMENT DURING DRY PLASMA ETCHING

CROSS-REFERENCE TO RELATED APPLICATIONS

Pursuant to 37 C.F.R. §1.78(a)(4), this application claims the benefit of and priority to U.S. Provisional Application No. 62/069,387 filed on Oct. 28, 2014, which is expressly incorporated by reference herein in its entirety.

FIELD OF INVENTION

The invention relates to a method for selectively etching a heterogeneous layer on a substrate.

DESCRIPTION OF RELATED ART

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Photolithography is a standard technique used to manufacture semiconductor integrated circuitry by transferring geometric shapes and patterns on a mask to the surface of a semiconductor wafer. However, current state-of-the-art photolithography tools allow minimum feature sizes down to about 25 nm. Accordingly, new methods are needed to provide smaller features.

Self-assembly of block copolymers (BCPs) has been considered a potential tool for improving the resolution to better values than those obtainable by prior art lithography methods alone. Block copolymers are compounds useful in nanofabrication because they may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1 nm to 5 nm and may be manipulated by modification of the chemical compositions of the blocks of the copolymer.

A block copolymer may form many different phases upon self-assembly, dependent upon the volume fractions of the blocks, degree of polymerization within each block type (i.e., number of monomers of each respective type within each respective block), the optional use of a solvent and surface interactions. When applied in a thin film, the geometric confinement may pose additional boundary conditions that may limit the numbers of phases. In general, spherical (e.g., cubic), cylindrical (e.g., tetragonal or hexagonal) and lamellar phases (i.e., self-assembled phases with cubic, hexagonal or lamellar space-filling symmetry) are practically observed in thin films of self-assembled block copolymers, and the phase type observed may depend upon the relative volume fractions of the different polymer blocks. The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide or direct self-assembly of a block copolymer onto a surface are grapho-epitaxy and chemical pre-patterning, also called chemi-epitaxy. In the grapho-epitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance, if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In chemi-epitaxy, the self-assembly of block copolymer domains is guided by a chemical pattern (i.e., a chemical template) on the substrate. Chemical affinity between the chemical pattern and at least one of the types of copolymer blocks within the block copolymer chain may result in the precise placement (also referred to herein as "pinning") of one of the domain types onto a corresponding region of the chemical pattern on the substrate. For instance, if the block copolymer is a di-block copolymer with A and B blocks, where A is hydrophilic and B is hydrophobic in nature, and the chemical pattern comprises of a surface having hydrophobic regions adjacent to regions that are neutral to both A and B, the B domain may preferentially assemble onto the hydrophobic region and consequently force subsequent alignment of both A and B blocks on the neutral areas. As with the grapho-epitaxy method of alignment, the resolution may be improved over the resolution of the patterned substrate by the block copolymer pattern subdividing the spacing of pre-patterned features on the substrate (so-called density or frequency multiplication). However, chemi-epitaxy is not limited to a linear pre-pattern; for instance, the pre-pattern may be in the form of a 2-D array of dots suitable as a pattern for use with a cylindrical phase-forming block copolymer. Grapho-epitaxy and chemi-epitaxy may be used, for instance, to guide the self-organization of lamellar or cylindrical phases, where the different domain types are arranged side-by-side on a surface of a substrate.

Accordingly, to achieve the advantages provided by grapho-epitaxy and chemi-epitaxy of block copolymers, new lithographic patterning and directed self-assembly techniques are required, including the ability to integrate such materials in patterning workflows. One example of a block copolymer is polystyrene-b-poly(methyl methacrylate) (PMMA). However, when removing the PMMA portion from the polystyrene-b-poly(methyl methacrylate) (PS-b-PMMA) layer to leave behind a polystyrene (PS) pattern, conventional etching techniques have suffered. Due to the organic nature of both materials, and their similarities, developing an etch chemistry with suitable etch selectivity has been challenging. Furthermore, conventional etch processes produce pattern defectivity, such as line edge roughness/line width roughness (LER/LWR), that are unacceptable. In extreme cases, the defectivity of the PS can be catastrophic due to pattern collapse as will be discussed in more detail below. In future schemes, the ability to selectively remove one material while retaining the other material using dry etching techniques is paramount for the success for such patterning implementation. Thus, there is a need for controlled etching techniques and processes that produce acceptable results.

SUMMARY OF THE INVENTION

Embodiments of the invention relate to a method for selectively etching a heterogeneous layer, such as a patterning layer or direct self-assembly (DSA) layer on a substrate. Other embodiments of the invention relate to selectively removing a first material, such as a first domain of a self-assembled block copolymer layer, while retaining a second material, such as a second domain of the self-assembled block copolymer layer.

According to one embodiment, a method of etching a layer on a substrate is described. The method includes disposing a substrate having a heterogeneous layer composed of a first material and a second material in a processing space of a plasma processing system, wherein the heterogeneous layer has an initial upper surface exposing the first material and the second material to a plasma environment in the processing space, and performing a modulated plasma etching process to selectively remove the first material at a rate greater than removing the second material. The modulated plasma etching process includes a modulation cycle that preferentially reacts an etchant with the first material during a first phase of the modulation cycle, and differentially adheres a passivant on the second material relative to the first material during a second phase of the modulation cycle.

DETAILED DESCRIPTION OF SEVERAL EMBODIMENTS

Figure 1A:
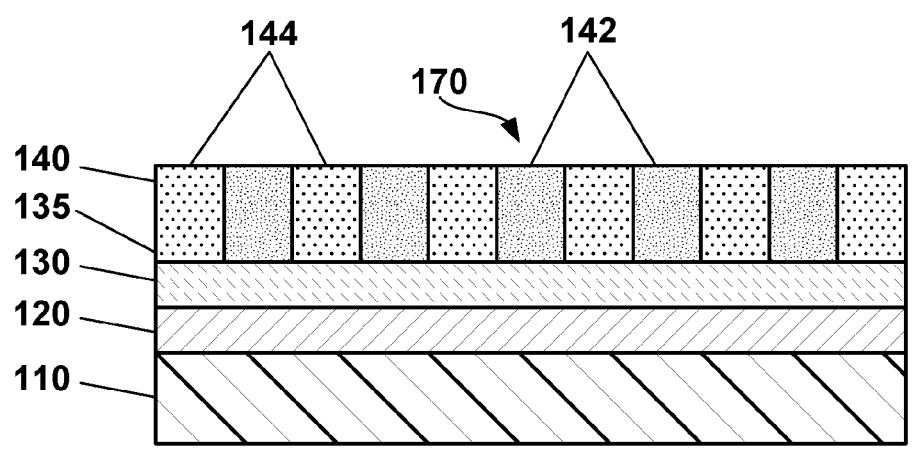
FIGS. 1A and 1B illustrate a schematic representation of a direct self-assembled layer on a substrate.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter and N is the total degree of polymerization for the block copolymer. According to embodiments of the present invention, the $\chi N$ value of one polymer block with at least one other polymer block in the larger copolymer may be equal to or greater than about 10.5.

As used herein, the term "block copolymer" means and includes a polymer composed of chains where each chain contains two or more polymer blocks as defined above and at least two of the blocks are of sufficient segregation strength (e.g., $\chi N > 10.5$) for those blocks to phase separate. A wide variety of block polymers are contemplated herein including di-block copolymers (i.e., polymers including two polymer blocks (AB)), tri-block copolymers (i.e., polymers including three polymer blocks (ABA or ABC)), multi-block copolymers (i.e., polymers including more than three polymer blocks (ABCD, etc.)), and combinations thereof.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

The terms "microphase segregation" and "microphase separation," as used herein mean and include the properties by which homogeneous blocks of a block copolymer aggregate mutually, and heterogeneous blocks separate into distinct domains. In the bulk, block copolymers can self-assemble into ordered morphologies, having spherical, cylindrical, lamellar, bicontinuous gyroid, or miktoarm star microdomains, where the molecular weight of the block copolymer dictates the sizes of the microdomains formed.

The domain size or pitch period ($L_o$) of the self-assembled block copolymer morphology may be used as a basis for designing critical dimensions of the patterned structure. Similarly, the structure period ($L_s$), which is the dimension of the feature remaining after selectively etching away one of the polymer blocks of the block copolymer, may be used as a basis for designing critical dimensions of the patterned structure. The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), supercritical fluid-assisted annealing, or absorption-based annealing (e.g., optical baking). As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar (e.g., organometallic containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a di-block copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a block copolymer mask are disclosed in U.S. Pat. No. 7,579,279, U.S. Pat. No. 7,723,009, and to U.S. application Ser. No. 13/830,859, CHEMI-EPITAXY IN DIRECTED SELF-ASSEMBLY APPLICATIONS USING PHOTO-DECOMPOSABLE AGENTS, by Sommervell, et al., filed on Mar. 14, 2013, the entire disclosure of each of which is incorporated by reference herein.

In material processing methodologies, pattern etching can comprise the application of a thin layer of radiation-sensitive material, such as photo-resist, to an upper surface of a substrate, followed by patterning of the thin layer of material using lithographic techniques. In DSA patterning, the initial pattern is formed by the phase-separation of two or more phases present in a DSA layer, the selective removal of at least one phase using dry pattern etching, and the retention of at least one remaining phase, thereby providing a pattern for subsequent dry pattern etching. During dry pattern etching, a plasma etching process can be utilized, wherein plasma is formed from a process gas by coupling electromagnetic (EM) energy, such as radio frequency (RF) power, to the process gas in order to heat electrons and cause subsequent ionization and dissociation of the atomic and/or molecular constituents of the process gas. Using a series of dry etching processes, the initial pattern may be formed in the DSA layer, followed by transfer of the pattern to the underlying layers within a film stack, including the one or more material layers that are desired for the end product, e.g., electronic device. To do so, the selective removal of one material relative to other material(s) is necessary. And, among other things, during the pattern transfer process, profile control for the pattern extended into underlying layers is of critical importance.

As described above, direct self-assembled block copolymer layers, such as polystyrene-b-poly(methyl methacrylate) (PS-b-PMMA), have proven useful in sub-22 nm patterning schemes. However, to remove the self-assembled PMMA portion while retaining the PS portion, a highly selective etch process is required.

Figure 1B:
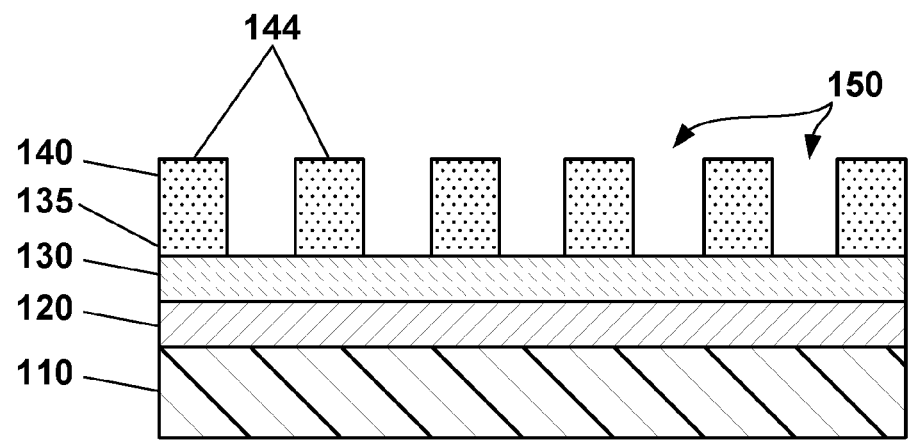
Figure 2:
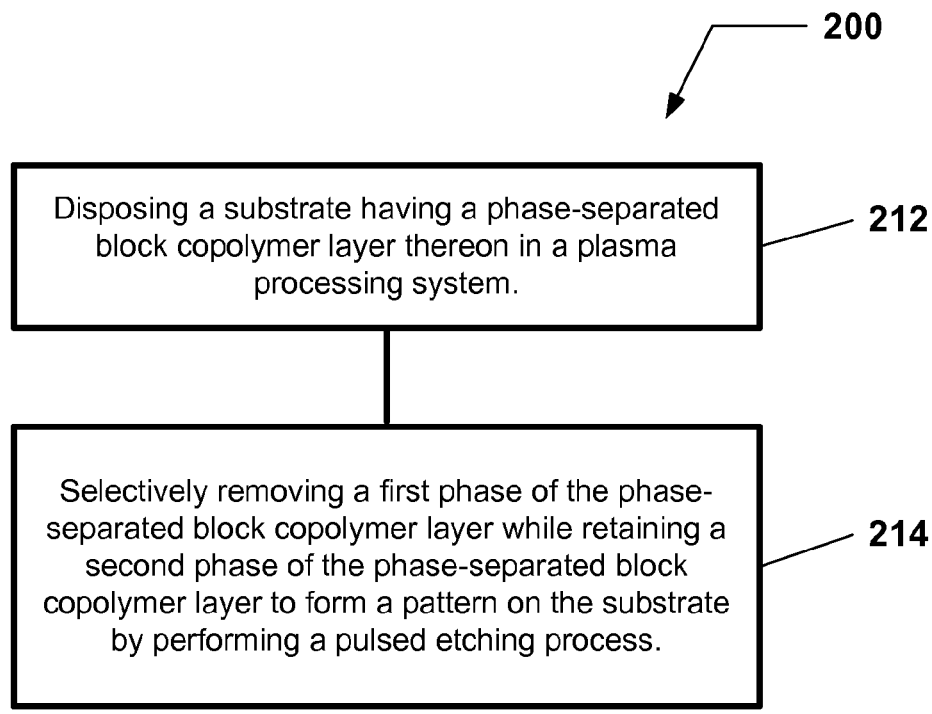
FIG. 2 provides a flow chart illustrating a method of etching a direct self-assembled layer on a substrate according to an embodiment.

Referring now to the drawings, wherein like reference numerals designate identical or corresponding parts throughout the several views, FIGS. 1A and 1B, and FIG. 2 illustrate a method for patterning a direct self-assembled layer on a substrate according to an embodiment. Material layers such as substrate 110, second material layer 120, first material layer 130, and patterned neutral layer 135 are similarly numbered and have the same function and usage in FIGS. 1A and 1B. The method is illustrated in a flow chart 200, and begins in 210 with disposing a substrate having a self-assembled block copolymer layer thereon in a plasma processing system. As shown in FIGS. 1A and 1B, a substrate 110 having a self-assembled block copolymer layer 140 arranged thereon is provided using a direct self-assembly (DSA) technique. With reference to FIG. 1A, the self-assembled block copolymer layer 140 was applied and allowed to phase separate to form a pattern over the patterned neutral layer 135 and exposed first layer of material 130. Substrate 110 may further include second material layer 120 underlying the first material layer 130. The self-assembled block copolymer layer 140 comprises at least two polymer domains 142, 144, which may be selectively etched relative to one another, i.e., an etch chemistry is selected to achieve at least an etch selectivity of 2-2.5 between etching the first domain 142 of the block copolymer relative to etching the second domain 144 of the block copolymer when using a defined set of etching conditions (the etch rate of the first domain 142 is at least twice the etch rate of the second domain 142 using the defined set of etching conditions). Furthermore, the self-assembled block copolymer layer 140 is composed of materials that can self-organize in a desired and predictable manner to achieve the first and second domains 142, 144 of FIG. 1A, e.g., the polymer blocks are immiscible and will segregate under appropriate conditions to form domains predominantly containing a single block species.

Substrate 110 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof. Substrate 110 can be of any size, for example a 200 mm (millimeter) substrate, a 300 mm substrate, or an even larger substrate. In one example, substrate 110 includes a tensile-strained Si layer.

The block copolymer may be deposited by various methods, including, e.g., spin-on coating, spin casting, brush coating or vapor deposition. For example, the block copolymer may be provided as a solution in a carrier solvent such as an organic solvent, e.g., toluene. The solution of the block copolymer can be applied to the layered structure and the carrier solvent subsequently removed to provide the block copolymer. While the invention is not bound by theory, it will be appreciated that the different block species are understood to self-aggregate due to thermodynamic considerations in a process similar to the domain separation of materials. The self-organization is guided by the physical interfaces of patterned neutral layer 135, as well as the chemical affinity between the chemical species of the underlying first layer of material 130 and at least one of the polymer blocks within the block copolymer chain. Accordingly, the constituent blocks of the block copolymers can orient themselves along the length of the patterned neutral layer 135 and underlying first material layer 130 due to interfacial interactions and chemical affinities.

With continued reference to FIG. 1A, the forming of the self-assembled block copolymer layer 140 is accomplished by exposing to annealing conditions to facilitate the self-assembly of the block copolymer into a plurality of alternating domains, i.e. first and second domain 142, 144 aligned side-by-side between as shown. In this exemplary embodiment, shown in FIG. 1A, the self-assembled block polymer 140 has first and second domains 142, 144 that are arranged where the first layer of material 130 has a chemical affinity for the polymer block comprising domain 144. Accordingly, the chemical affinity between one of the polymer blocks of the block copolymer and the first layer of material 130 acts to pin the second domain 144 on substrate 110. Conversely, if the chemical affinity is neutral between the patterned neutral layer 135 and the polymer blocks of the block copolymer, both domains 142, 144 may self-organize across this neutral surface, which advantageously provides frequency multiplication. In the embodiment shown in FIG. 1A, a 3× frequency multiplication is shown. It should be appreciated that other frequency multiplications may be obtained ranging from 1×-10×. In the case of 1× frequency multiplication, the neutral layer can also be made chemically attractive to the block that comprises domain 142 and so further increase the chemical driving force for assembly. In alternative embodiments, the neutral layer 135 is continuous, thus promoting frequency multiplication.

It should be appreciated that the dimension of the pinning region (e.g., the dimension of feature 170 in the instant embodiment) can be designed to correlate to the $L_o$ of the self-assembled block copolymer morphology. If the pinning region is about $L_o/2$, it will effectively match the size of one of the blocks of the block copolymer. Pinning regions of about $3 L_o/2$ will also effectively serve to pin one of the blocks of the block copolymer. Accordingly, according to one aspect of the present invention, the method also includes preparing a feature having a dimension that is in a range from about $0.30 L_o$ to about $0.9 L_o$; or from about $1.25 L_o$ to about $1.6 L_o$.

In forming the layered structure shown in FIG. 1A, the self-organization may be facilitated and accelerated by annealing. The temperature of the annealing process may be chosen to be sufficiently low to prevent adversely affecting the block copolymers or the layered structure. The anneal may be performed at a temperature of less than about 150° C., less than about 300° C., less than about 250° C., less than about 200° C. or about 180° C. in some embodiments. According to another embodiment, the annealing process may include a solvent anneal, which generally reduces the annealing temperature. Traditional solvent annealing methods can be used, as well as newer techniques such as that disclosed in U.S. patent application Ser. No. 13/843,122, filed on Mar. 15, 2013 entitled SOLVENT ANNEAL PROCESSING FOR DIRECTED-SELF ASSEMBLY APPLICATIONS, which is incorporated herein by reference in its entirety.

According to one aspect, in order to facilitate faster annealing times without oxidizing or burning the organic polymer block of the block copolymer, the annealing may be performed in a low oxygen atmosphere at annealing temperature greater than about 250° C. in less than about 1 hour of anneal time. As used herein, the low oxygen atmosphere comprises less than about 50 ppm oxygen. For example, the low oxygen atmosphere may include less than about 45 ppm, less than about 40 ppm, less than about 35 ppm, less than about 30 ppm, less than about 25 ppm, less than about 20 ppm, or ranges in between thereof. Additionally, the low oxygen atmosphere annealing methods may be accompanied by thermal quenching methods. Exemplary low oxygen atmosphere and thermal quenching annealing methods are disclosed in U.S. Patent Application Ser. No. 61/793,204, filed on Mar. 15, 2013 entitled MULTI-STEP BAKE APPA- RATUS AND METHOD FOR DIRECTED SELF-ASSEMBLY LITHOGRAPHY CONTROL, which is incorporated herein by reference in its entirety.

The anneal time may range from about several hours to about 1 minute. For example, annealing times for temperatures above 250° C. may range from about 1 hour to about 2 minutes, from about 30 minutes to about 2 minutes, or from about 5 minutes to about 2 minutes.

According to one embodiment, the annealing temperature may be within the range from about 260° C. to about 350° C., wherein the low oxygen atmosphere comprises less than about 40 ppm oxygen. For example, the layer of the block copolymer 180 may be exposed to annealing conditions of 310° C. in less than about 40 ppm oxygen for about a 2 minutes to about 5 minutes.

Accordingly, the annealing step of the layer of block copolymer forms a layer of self-assembled block copolymer 140 having a first domain 142 that is formed of one polymer block, and sandwiched by domains 144 that are formed of another block polymer. Further, based on the intrinsic etch selectivity provided by the choice of the appropriate polymer blocks, it will be appreciated that one of the domains may be selectively removed in a single step using a single etch chemistry or may be removed using multiple etches with different etch chemistries.

For example, where the first domain 142 is formed of polymethyl methacrylate (PMMA) and the second domain 144 is formed of polystyrene (PS), the PMMA domain 142 may be removed by performing a selective plasma etch, to be described herein, while leaving behind the PS domain 144. It will be appreciated that the dimensions of the resulting features may vary, depending on the size of the copolymer used and process conditions. It should be further appreciated that domain phases other than the lamellar phases shown in FIG. 1A are also contemplated, and therefore the present invention is not limited thereto.

As mentioned above, conventional etching techniques have produced poor etch selectivity, as well as pattern defectivity, such as line edge roughness/line width (LER/LWR), that are unacceptable and in extreme cases, the defectivity of the PS is catastrophic due to pattern collapse.

In FIG. 1B and in 220 of FIG. 2, the first domain 142 of the self-assembled block copolymer layer 140 is selectively removed while retaining the second domain 144 of the self-assembled block copolymer layer 140 to form a pattern 150 on the substrate 110 by performing a pulsed etching process. The pulsed etching process includes: (i) introducing a process gas composition to the plasma processing system, wherein the process composition includes a $C_xH_yR_z$-containing gas, wherein R represents a halogen element, x and y represent a real number greater than 0, and z represents a real number greater than or equal to 0; (ii) igniting plasma using a plasma source; (iii) electrically biasing a substrate holder that supports the substrate with radio frequency (RF) power; and (iv) pulsing the RF power for the electrical biasing.

The $C_xH_yR_z$-containing gas can have a hydrogen-to-carbon ratio (H/C) greater than unity, and a hydrogen-to-halogen ratio (H/R) greater than or equal to unity. For example, the $C_xH_yR_z$-containing gas can include $CH_4$, $C_2H_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, $C_6H_{12}$, $CH_3F$, or $CH_2F_2$, or any combination of two or more thereof.

The process composition can include an oxygen-containing gas, such as O, $O_2$, $O_3$, CO, $CO_2$, NO, $N_2O$, $NO_2$, etc., and a noble gas, such as Ar or He. The process composition may further include a halogen-containing gas and an optional additive gas having: C and F; C, H, and F; or N and F, as atomic constituents. The halogen-containing gas may include one or more gases selected from the group consisting of $Cl_2$, $Br_2$, HBr, HCl, and $BCl_3$.

During the pulsed etching process, at least one property of the pulsing of RF power may be adjusted. The at least one property may include a pulse amplitude, a pulse frequency, a pulse duty cycle, a pulse waveform, or a pulse phase. In one embodiment, the pulsing of RF power for the electrical biasing comprises pulsing the RF power between an off-state and an on-state.

In one embodiment, the pulsed etching process may comprise a process parameter space that includes: a chamber pressure ranging up to about 1000 mtorr (millitorr) (e.g., up to about 200 mtorr, or up to about 50 to 150 mtorr), an oxygen-containing gas flow rate ranging up to about 2000 sccm (standard cubic centimeters per minute) (e.g., up to about 1000 sccm, or about 1 sccm to about 200 sccm), a $C_xH_yR_z$-containing gas flow rate ranging up to about 2000 sccm (e.g., up to about 1000 sccm, or about 1 sccm to about 100 sccm), an optional noble gas (e.g., He or Ar) flow rate ranging up to about 2000 sccm (e.g., up to about 1000 sccm), an upper electrode (e.g., element 770 in FIG. 7) RF power ranging up to about 2000 W (watts) (e.g., up to about 1000 W, or up to about 600 W), a lower electrode (e.g., element 522 in FIG. 7) RF bias ranging up to about 1000 W (e.g., up to about 600 W, or up to about 100 W, or up to 50 W), a lower electrode pulse frequency ranging up to about 1000 Hz (e.g., up to about 100 Hz, or up to about 10 Hz, or up to 1 Hz), and a lower electrode pulse duty cycle ranging from about 1:4 (20%—ON/80%—OFF) to about 4:1 (80%—ON/20%—OFF) (e.g., from about 1:2 to about 2:1, or about 1:1 (50%—ON/50%—OFF)). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

Figure 3A:
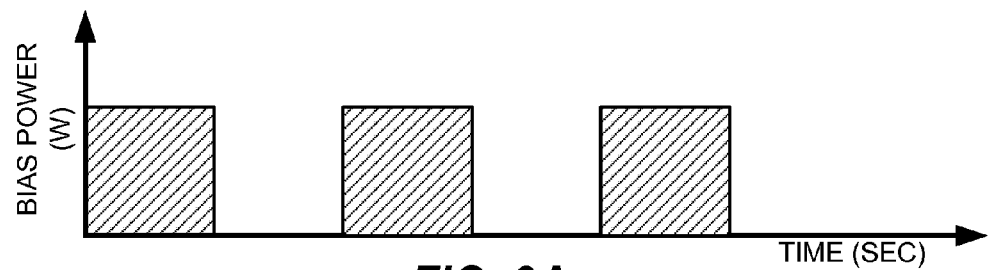
FIGS. 3A through 3E provide a schematic graphical representation of a method of etching a direct self-assembled layer on a substrate according to other embodiments.
Figure 3B:
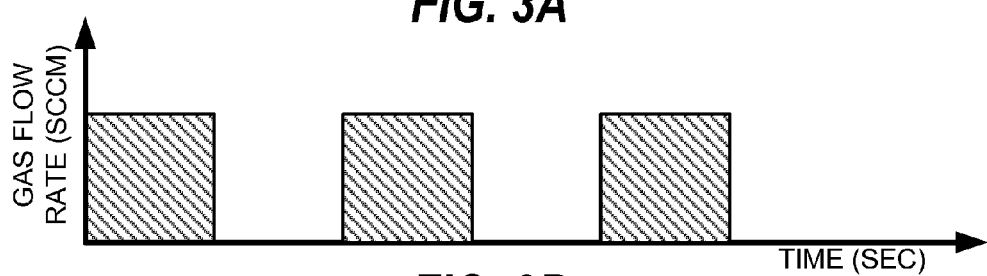
Figure 3C:
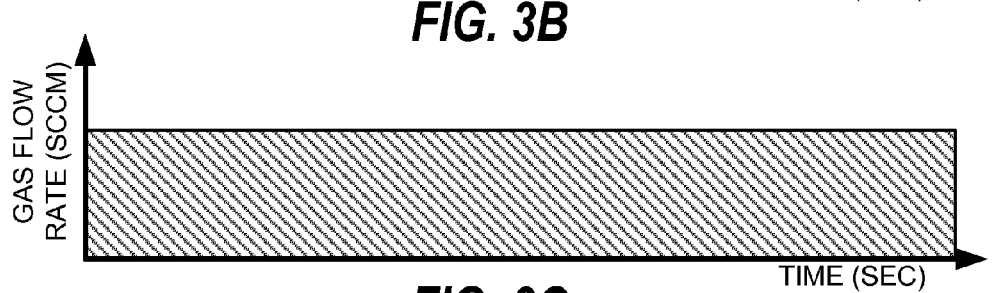
Figure 3D:
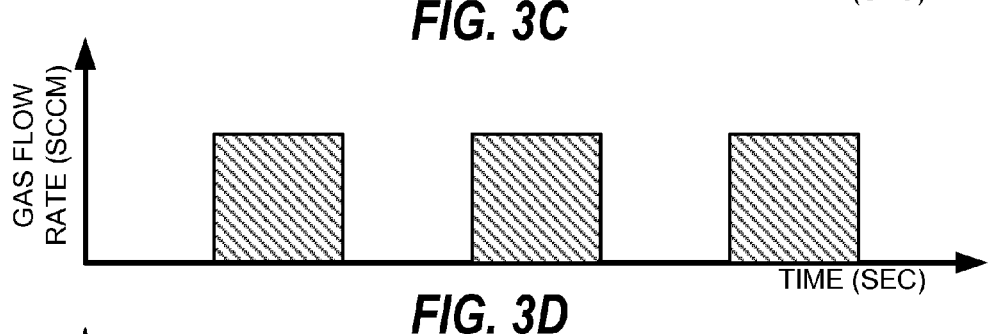
Figure 3E:
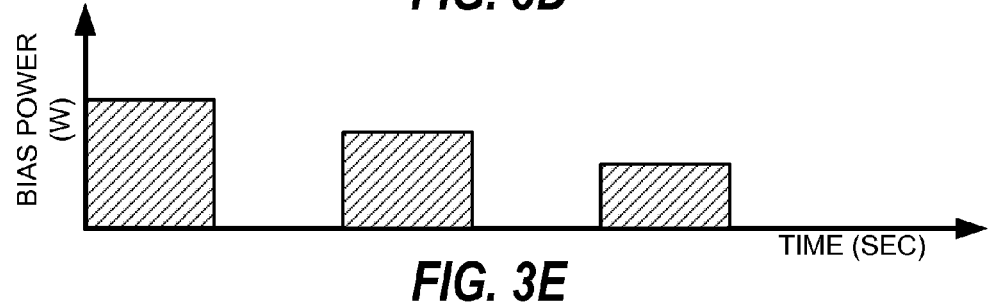

Turning now to the graphical illustrations of FIGS. 3A through 3E, several embodiments are provided for pulsing the RF power and introducing the $C_xH_yR_z$-containing gas. As shown in FIGS. 3A and 3B, the $C_xH_yR_z$-containing gas is introduced as a pulsed flow that is substantially in-phase with the pulsing of RF power (i.e., $C_xH_yR_z$-containing gas is introduced during RF power on-state). Alternatively, as shown in FIGS. 3A and 3C, the $C_xH_yR_z$-containing gas is introduced as a continuous flow during the pulsing of RF power (i.e., $C_xH_yR_z$-containing gas is introduced during RF power on- and off-states). Alternatively yet, as shown in FIGS. 3A and 3D, the $C_xH_yR_z$-containing gas is introduced as a pulsed flow that is substantially out-of-phase with the pulsing of RF power (i.e., $C_xH_yR_z$-containing gas is introduced during RF power off-state). The $C_xH_yR_z$-containing gas may be introduced as a pulsed flow that is substantially out-of-phase with the pulsing of RF power, yet there may be some overlap. Further, as shown in FIG. 3E, the RF power level (or RF amplitude) may be varied from one pulse to the next pulse. For example, the RF power level may be ramped downward or decreased during the electrical biasing of the substrate.

Figure 4A:
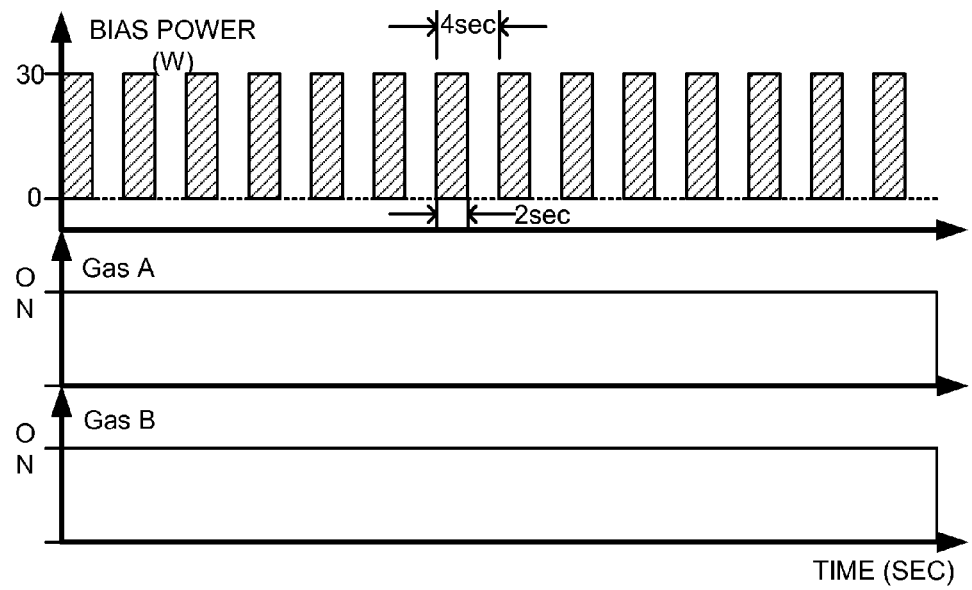
FIGS. 4A and 4B provide a schematic graphical representation of a method of etching a direct self-assembled layer on a substrate according to other embodiments.

In one embodiment, the pulsing of RF power for the electrical biasing may include: (i) pulsing the RF power at a first RF power level for a first time duration; (ii) flowing a first gas (Gas A) continuously, the first gas being a primary etchant; and (iii) flowing a second gas (Gas B) continuously, the second gas being a polymerizing or passivating gas (see FIG. 4A). As an example, the first gas may include $O_2$ and optionally Ar, and the second gas may include the $C_xH_yR_z$- containing gas. In alternative embodiments, the first gas, or the second gas, or both may be pulsed.

Figure 4B:
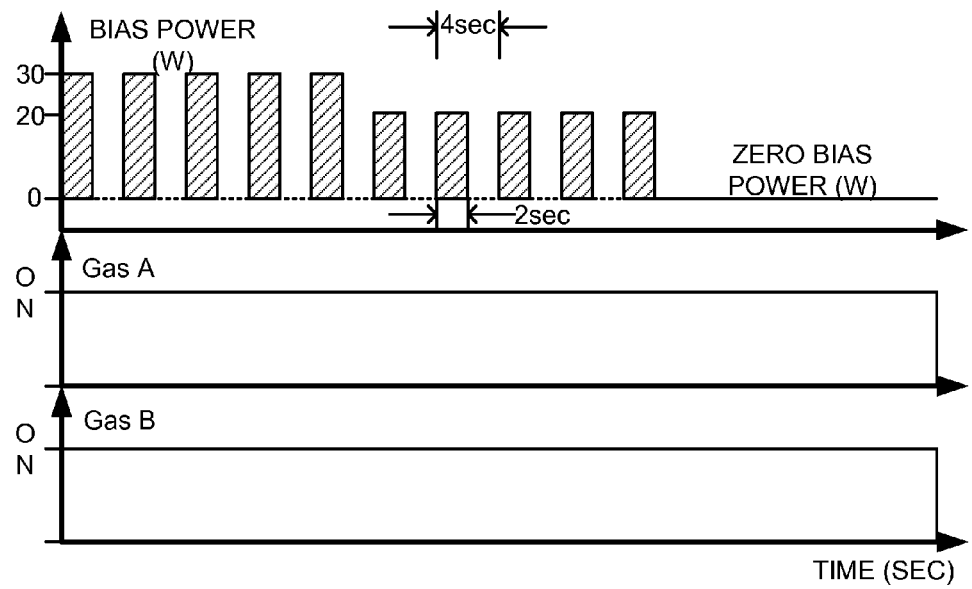

In another embodiment, the pulsing of RF power for the electrical biasing may include: (i) pulsing the RF power at a first RF power level for a first time duration; and (ii) pulsing the RF power at a second RF power level for a second time duration, wherein the second RF power level is less than the first RF power level, and the second time duration follows the first time duration. In another embodiment, the pulsing of RF power for the electrical biasing may further include: (iii) pulsing the RF power at a third RF power level for a third time duration, wherein the third RF power level is less than the second RF power level, and the third time duration follows the second time duration. Furthermore, in other embodiments, the pulsing of RF power for the electrical biasing may further include: (iv) flowing a first gas (Gas A) continuously, the first gas being a primary etchant; and (v) flowing a second gas (Gas B) continuously, the second gas being a polymerizing or passivating gas (see FIG. 4B). As an example, the first gas may include $O_2$ and optionally Ar, and the second gas may include the $C_xH_yR_z$-containing gas. In alternative embodiments, the first gas, or the second gas, or both may be pulsed.

In yet another embodiment, the pulsing of RF power for the electrical biasing may include: (i) pulsing the RF power at a first RF power level for a first time duration; (ii) pulsing the RF power at a second RF power level for a second time duration, wherein the second RF power level is less than the first RF power level, and the second time duration follows the first time duration; and (iii) terminating the pulsing of power for a third time duration, wherein the third time duration follows the second time duration.

In doing so, an etch rate of the first domain 142 that is at least 2.5 times greater than the etch rate of the second domain 144 can be achieved. Additionally, an etch rate of the first domain 142 that is at least 4 times greater than the etch rate of the second domain 144 can be achieved. Furthermore, an etch rate of the first domain 142 that is at least 8 times greater than the etch rate of the second domain 144 can be achieved. Further yet, an etch rate of the first domain 142 that is at least 10 times greater than the etch rate of the second domain 144 can be achieved.

As an example, Table 1 provides exemplary process conditions for patterning a direct self-assembled layer using a pulsed etching process. The performance for each pulsed etching process is assessed via measurement of the etch selectivity for the removal of the PMMA phase (i.e., the ratio of the etch rate of PMMA to the etch rate of PS). The pulsed etching processes include: (A) a first etching process without pulsing or addition of a $C_xH_yR_z$-containing gas as the baseline condition; (B) a second etching process with pulsing and addition of a $C_xH_yR_z$-containing gas; (C) a third etching process without pulsing, but addition of a $C_xH_yR_z$-containing gas; and (D) a fourth etching process without pulsing, but addition of a $C_xH_yR_z$-containing gas at the same flow rate as condition B. Each pulsed etching process may be performed in the plasma processing system of FIG. 7, to be described below. However, other plasma processing systems may be used.

For each condition, the power delivered to the upper electrode (UEL) and lower electrode (LEL) (when ON) is the same. Additionally, the gas flow rate of $O_2$ and Ar is the same for each condition. In condition B, pulsing of the RF power to the lower electrode (50% duty cycle) is performed in the presence of the $C_xH_yR_z$-containing gas. In conditions C and D, pulsing is not used, and the flow rate of the $C_xH_yR_z$-containing gas is varied. Clearly, the inventors have observed a distinct difference in etch selectivity when the power is pulsed to the lower electrode and when the $C_xH_yR_z$-containing gas is introduced. At low flow rates (e.g., 12 sccm of $CH_4$), a difference in etch selectivity is less noticeable. This difference becomes observable when the flow rate of $CH_4$ is increased, and bias pulsing is implemented.

TABLE 1

| Etching Process | UEL RF Power (W) | LEL RF Power (W) | Pulse Time (sec) | $O_2$ | Ar | $CH_4$ | Selectivity |
|---|---|---|---|---|---|---|---|
| A | 600 | 20 | 0 | X | Y | 0 | 4.82 |
| B | 600 | 20 | 2 | X | Y | 24 | 10.04 |
| C | 600 | 20 | 0 | X | Y | 12 | 4.84 |
| D | 600 | 20 | 0 | X | Y | 24 | 5.82 |

The inventors have also observed an increase in etch selectivity from sub-2 values to values in excess of 2 (e.g., Etching Process A) by reducing the bias power level to the lower electrode (e.g., 20 W). In one embodiment, the RF power to the lower electrode is reduced to a level sufficient to achieve an ion energy of 100 eV or less. In alternative embodiments, the RF power to the lower electrode is reduced to a level sufficient to achieve an ion energy of 50 eV or less.

In other embodiments, RF power may be supplied to the lower electrode and not the upper electrode. In yet other alternate embodiments to be discussed later, RF power and/or DC power may be coupled in any of the manners described through FIGS. 5 to 11 below.

Figure 4C:
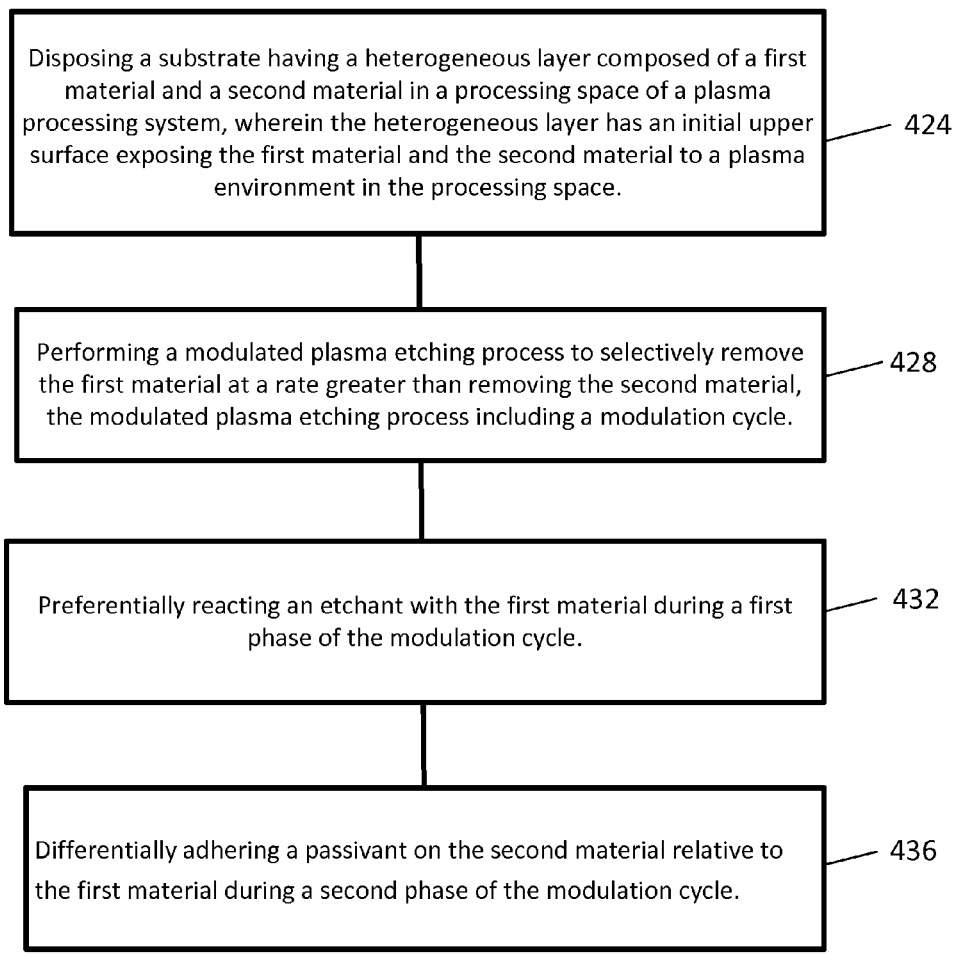
FIG. 4C is a flow chart illustrating a method of performing a modulated plasma etching process on a substrate including a modulation cycle according to an embodiment.

Referring now to FIG. 4C, FIG. 4C is a flow chart 420 illustrating a method of performing a modulated plasma etching process on a substrate, including a modulation cycle, according to an embodiment. In operation 424, a substrate having a heterogeneous layer composed of a first material and a second material is disposed in a processing space of a plasma processing system, wherein the heterogeneous layer has an initial upper surface exposing the first material and the second material to a plasma environment in the processing space. The exposed surface of the first material can be coplanar with an exposed surface of the second material. The first material and the second material can be silicon-containing materials of differing composition. Furthermore, the first material and the second material can be organic-containing materials of differing composition.

In operation 428, a modulated plasma etching process is performed to selectively remove the first material at a rate greater than removing the second material, the modulated plasma etching process including a modulation cycle. The first material can be a first domain of a self-assembled block copolymer layer and the second material can be a second domain of the self-assembled block copolymer layer. The first domain of the self-assembled block copolymer can be poly(meth methacrylate), and the second domain of the self-assembled block copolymer can be polystyrene. A modulation cycle is a set of operations using an etchant and/or a passivation agent to cause preferential etching or protecting a layer or portions of a layer of a substrate. In operation 432, an etchant preferentially reacts with the first material during a first phase of the modulation cycle. In operation 436, a passivant differentially adheres on the second material relative to the first material during a second phase of the modulation cycle.

Figure 4D:
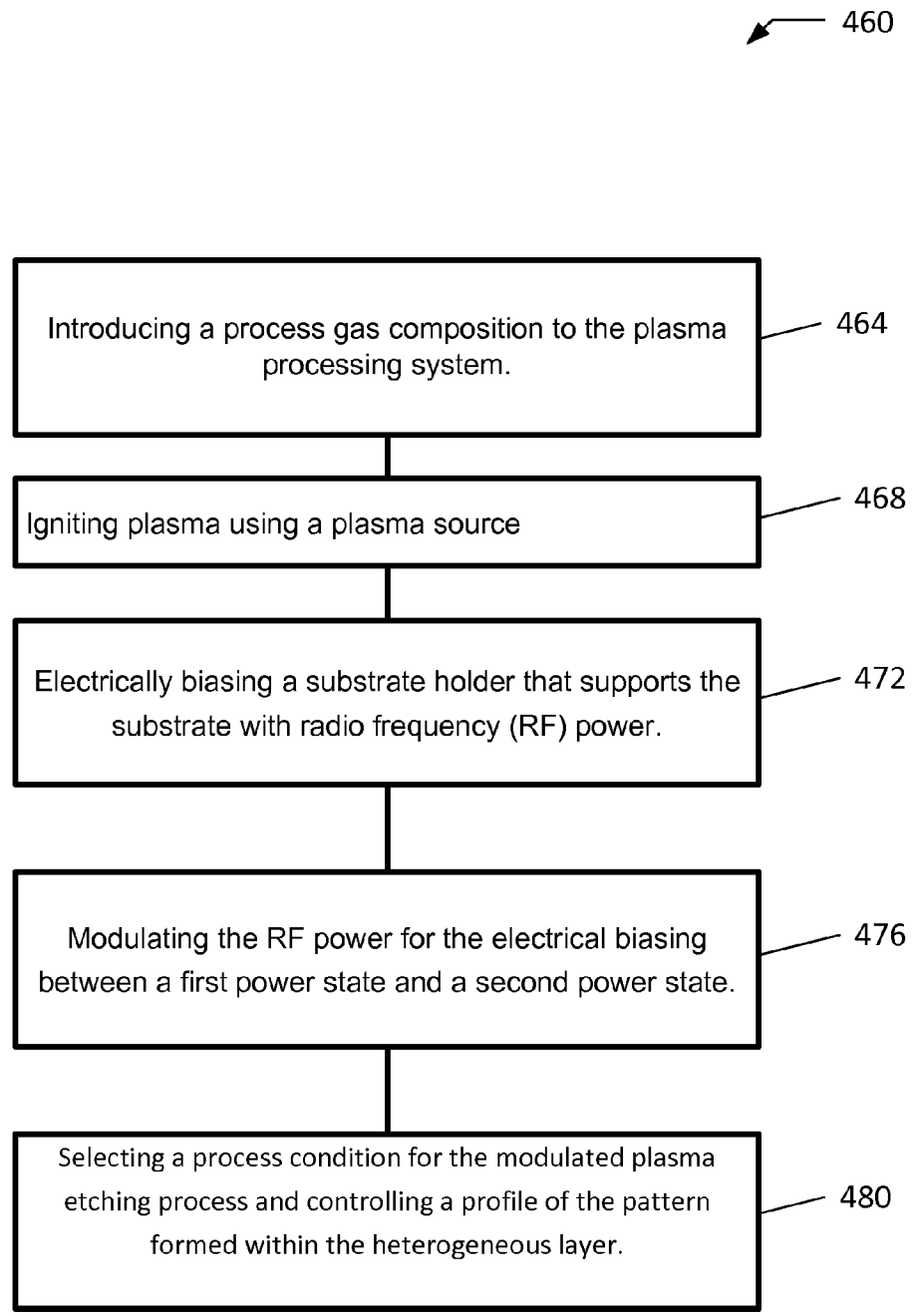
FIG. 4D is a flow chart of operations for plasma etching process on a substrate according to an embodiment.

FIG. 4D is a flow chart 460 of operations for a modulated plasma etching process on a substrate according to an embodiment. In operation 464, a process gas composition is introduced into the plasma processing system, the process composition including a CxHyRz-containing gas, wherein R represents a halogen element, x and y represent a real number greater than 0, and z represents a real number greater than or equal to 0. The CxHyRz-containing gas can have a hydrogen-to-carbon ratio (H/C) greater than unity, and a hydrogen-to-halogen ratio (H/R) greater than or equal to unity. In operation 468, plasma is ignited using a plasma source. In operation 472, a substrate holder that supports the substrate is electrically biased with radio frequency (RF) power.

In operation 476, the RF power for the electrical biasing between a first power state during the first phase of the modulation cycle and a second power state during a second phase of the modulation cycle is modulated to achieve the expected results of the plasma etching process. Modulation of RF power for the electrical biasing can comprise pulsing the RF power between an off-state and an on-state. In operation 480, a process condition for the modulated plasma etching process and for controlling a profile of the pattern formed within the heterogeneous layer is selected, the process condition including setting a pulse amplitude, a pulse frequency, a pulse duty cycle, or a pulse waveform, or any combination thereof.

The time duration to perform a specific etching process may be determined using design of experiment (DOE) techniques or prior experience; however, it may also be determined using optical detection. One possible method of optical detection is to monitor a portion of the emitted light spectrum from the plasma region that indicates when a change in plasma chemistry occurs due to a change in the etching process. After emission levels corresponding to the monitored wavelengths cross a specified threshold (e.g., decrease below a particular level, or increase above a particular level), a transition point in the etching process can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with transition detection.

Figure 6:
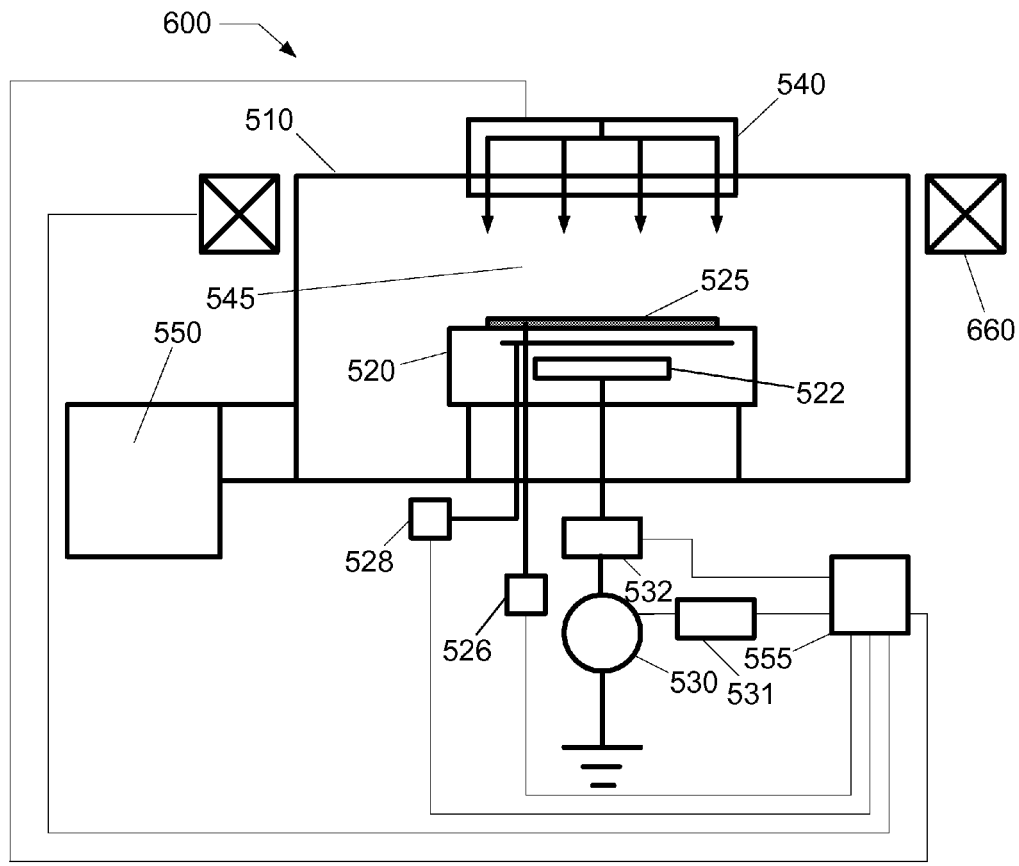
FIG. 6 shows a schematic representation of a plasma processing system according to another embodiment.
Figure 7:
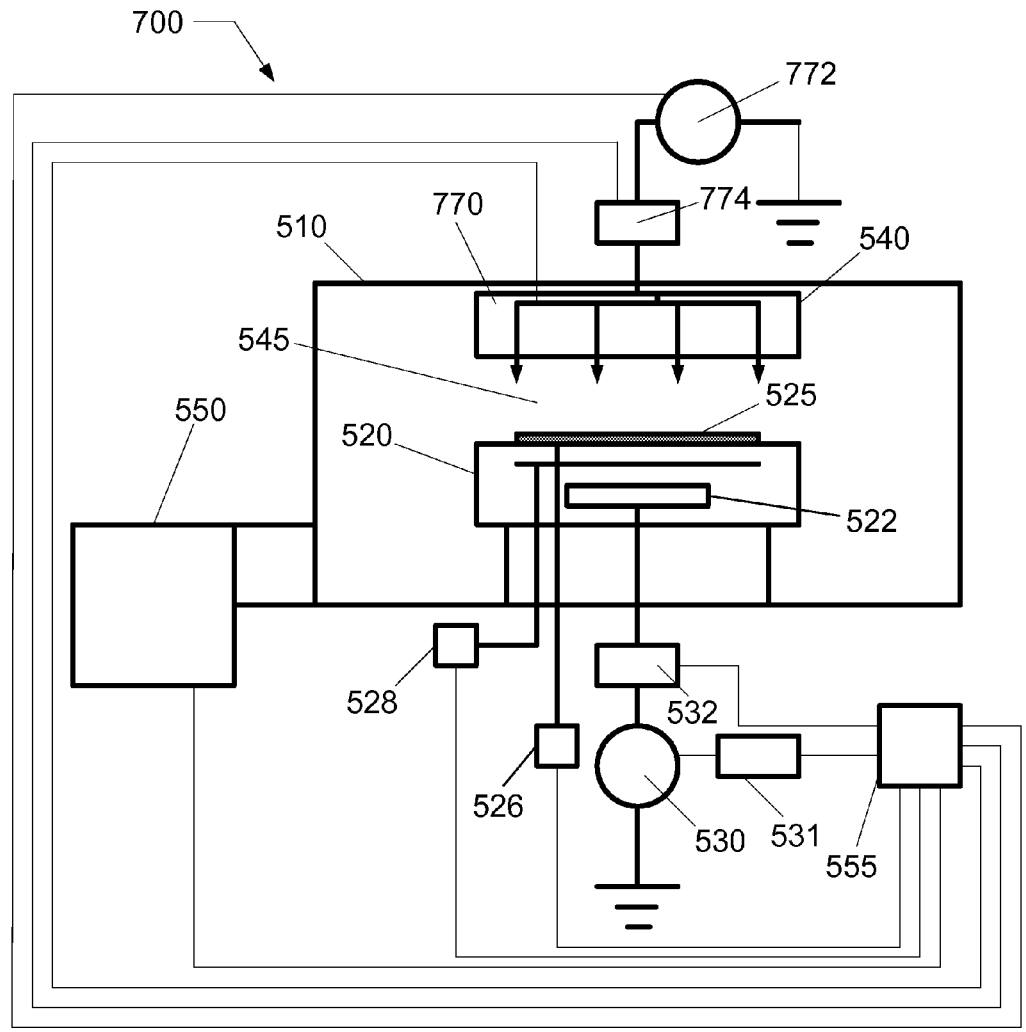
FIG. 7 shows a schematic representation of a plasma processing system according to another embodiment.

One or more of the methods for patterning a DSA layer described above may be performed utilizing a plasma processing system such as the one described in FIG. 7. However, the methods discussed are not to be limited in scope by this exemplary presentation. The method of patterning a gate stack on a substrate according to various embodiments described above may be performed in any one of the plasma processing systems illustrated in FIGS. 5 through 11 and described below. System components that are similarly numbered in FIGS. 5 through 11 perform the same functions and previous descriptions of these system components shall not be repeated in order to focus on the description of the new components.

Figure 5:
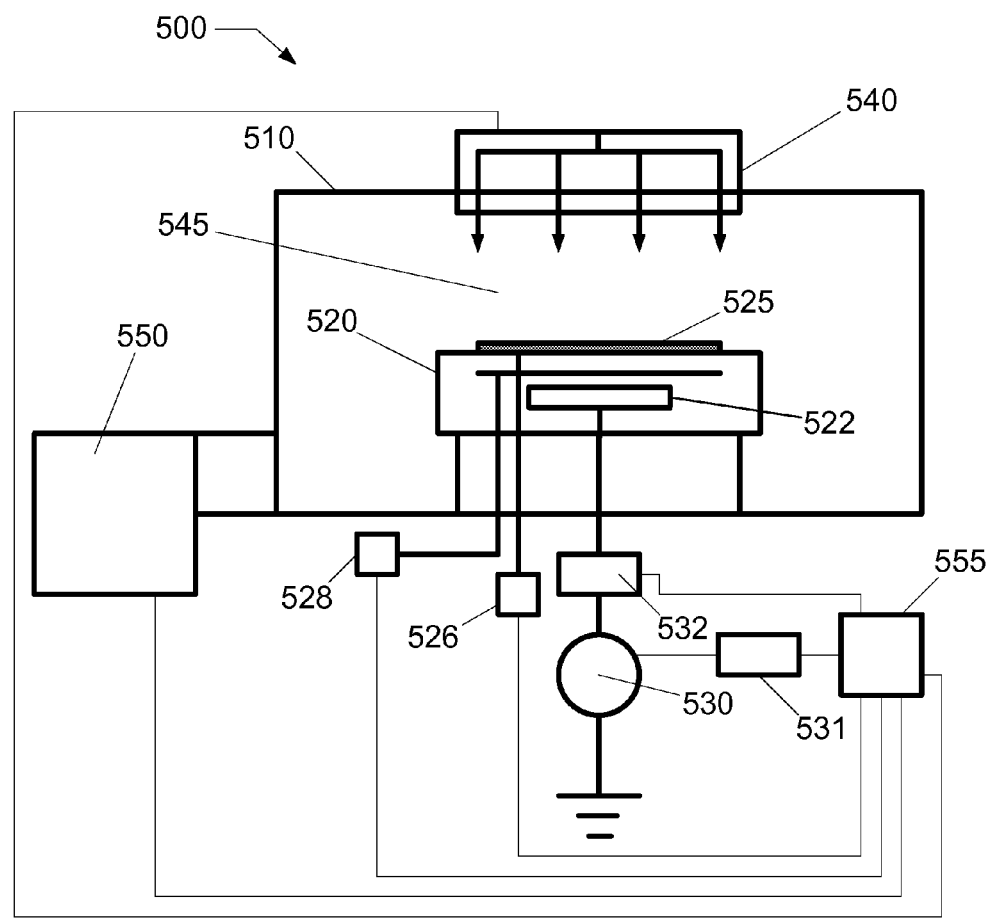
FIG. 5 shows a schematic representation of a plasma processing system according to an embodiment.

Referring to FIG. 5, according to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein a helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, -type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
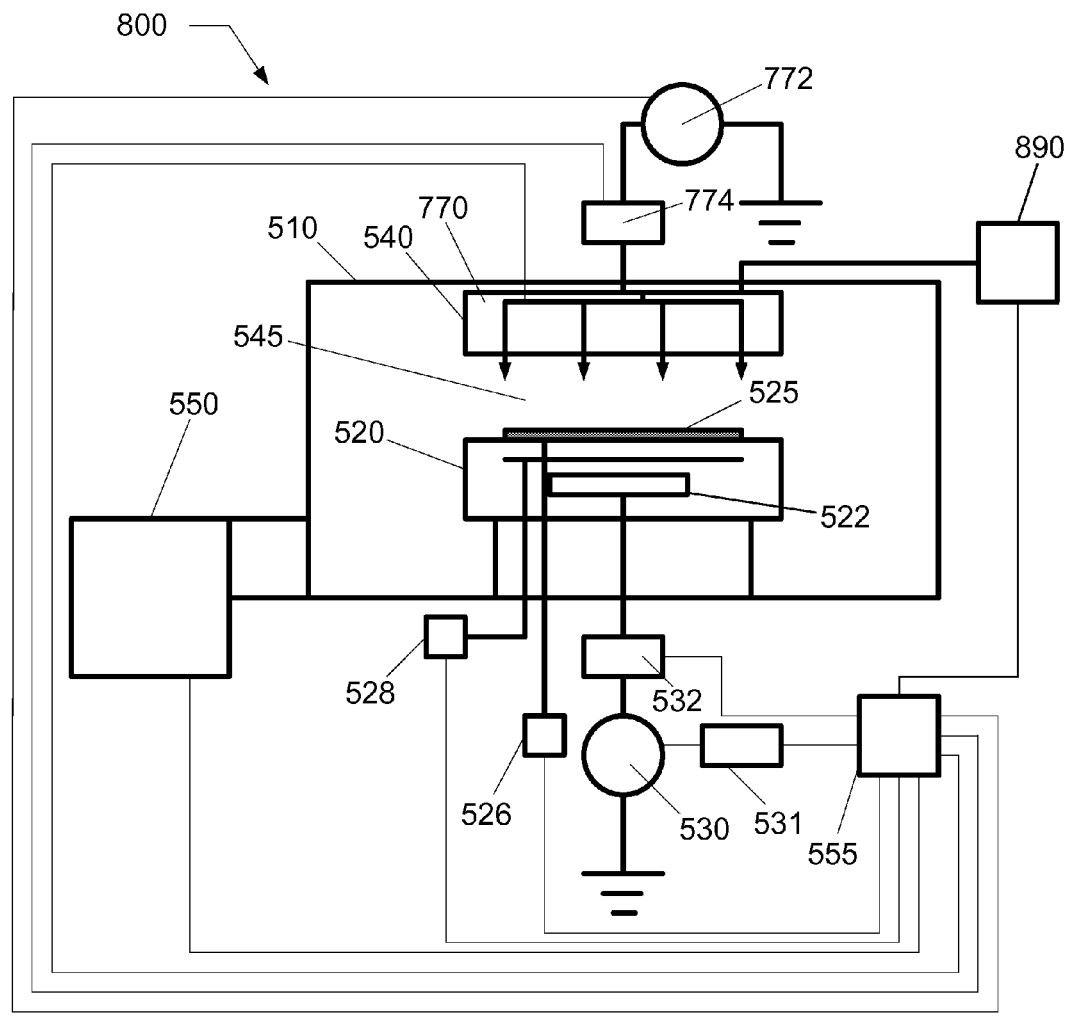
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
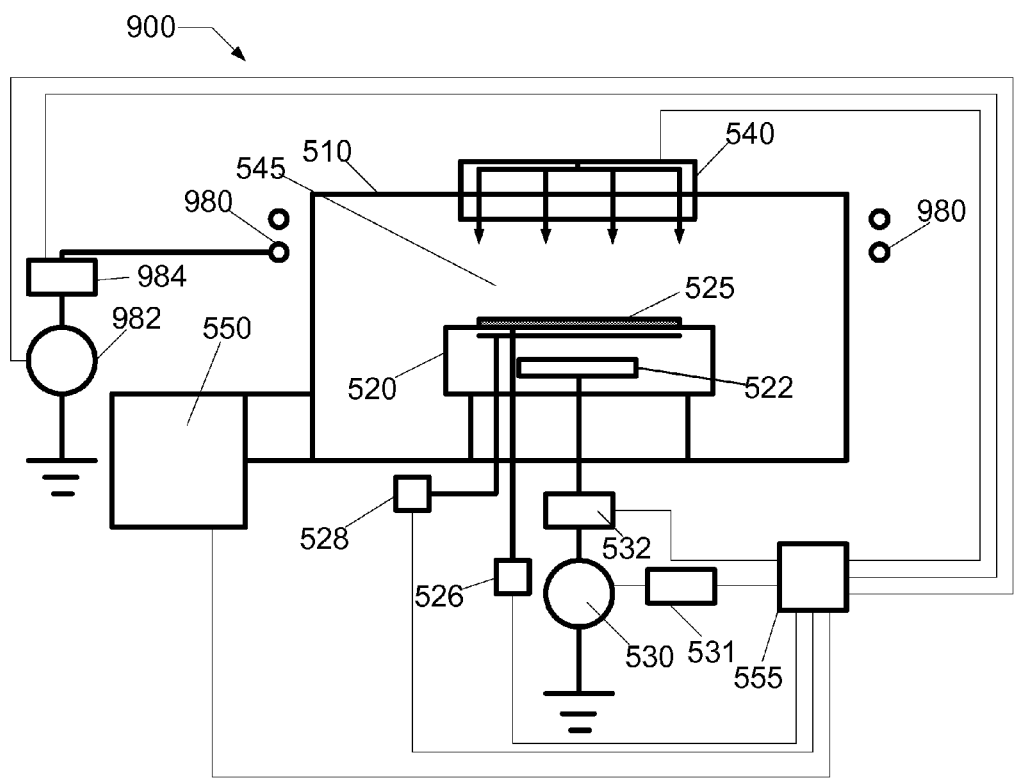
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
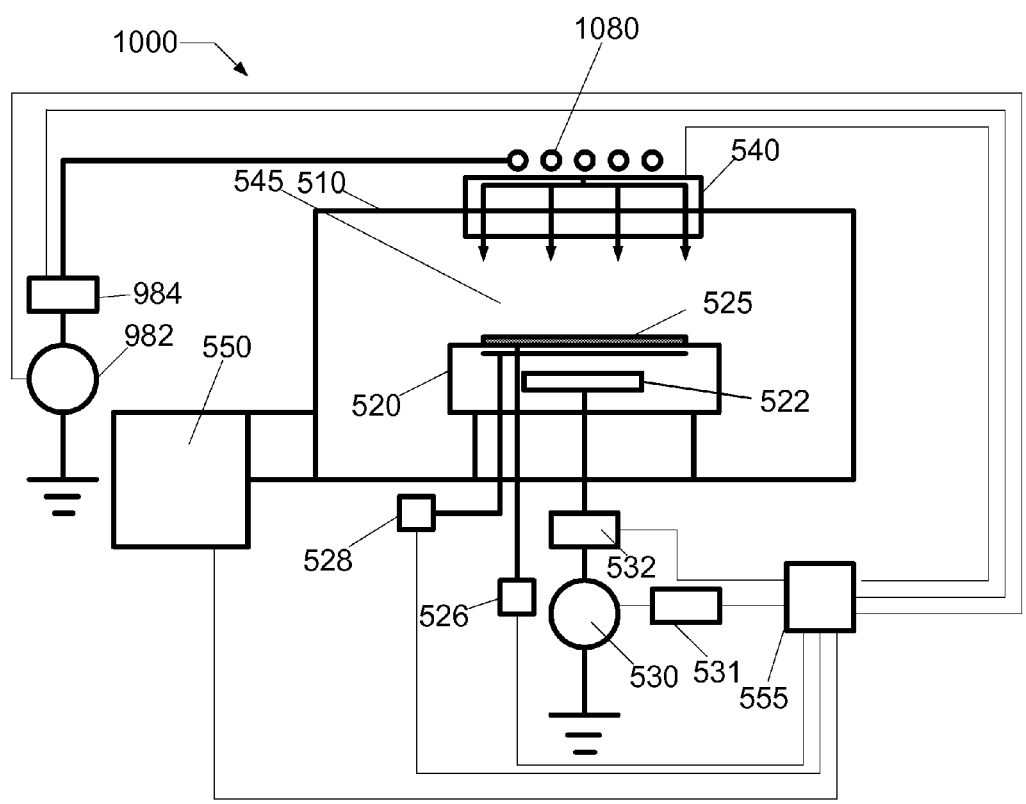
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP)

source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
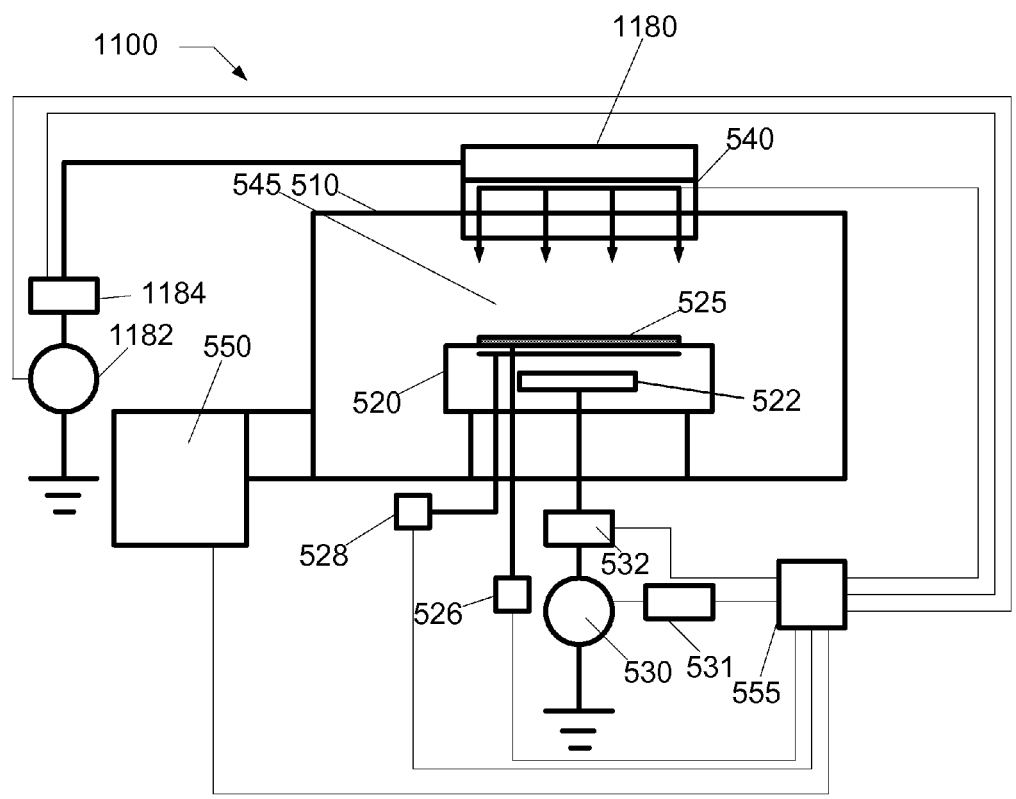
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1180. The SWP source 1180 can comprise a slot antenna, such as a radial line slot antenna, to which microwave power is coupled via microwave generator 1182 through optional impedance match network 1184.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching a layer on a substrate, comprising:
    disposing a substrate having a heterogeneous layer composed of a first material and a second material in a processing space of a plasma processing system, wherein the heterogeneous layer has an initial upper surface exposing the first material and the second material to a plasma environment in the processing space, and
    performing a modulated plasma etching process to selectively remove the first material at a rate greater than removing the second material by applying radio frequency (RF) power pulses to a substrate holder that supports the substrate, the modulated plasma etching process including a modulation cycle that:
    (i) preferentially reacts an etchant with the first material during a first phase of the modulation cycle, and
    (ii) differentially adheres a passivant on the second material relative to the first material during a second phase of the modulation cycle,
    wherein pulsing the RF power further includes:
        (i) pulsing the RF power at a first RF power level for a first time duration; and
        (ii) pulsing the RF power at a second RF power level for a second time duration,
    wherein the second RF power level is less than the first RF power level, and the second time duration follows the first time duration.

2. The method of claim 1, wherein an exposed surface of the first material is coplanar with an exposed surface of the second material.

3. The method of claim 1, wherein the first material and the second material are silicon-containing materials of differing composition.

4. The method of claim 1, wherein the first material and the second material are organic-containing materials of differing composition.

5. The method of claim 1, wherein the first material is a first domain of a self-assembled block copolymer layer and the second material is a second domain of the self-assembled block copolymer layer.

6. The method of claim 5, wherein the first domain of the self-assembled block copolymer is poly (meth methacrylate), and the second domain of the self-assembled block copolymer is polystyrene.

7. The method of claim 1, wherein the passivant is introduced as a pulsed flow that is in phase with the RF pulses.

8. The method of claim 1, wherein the passivant is introduced as a pulsed flow that is out of phase with respect to the RF pulses.

9. The method of claim 1, wherein the passivant includes a $C_xH_yR_z$-containing gas, wherein R represents a halogen element, x and y represent a real number greater than 0, and z represents a real number greater than or equal to 0.

10. A method of etching a layer on a substrate, comprising:
    disposing a substrate having a heterogeneous layer composed of a first material and a second material in a processing space of a plasma processing system, wherein the heterogeneous layer has an initial upper surface exposing the first material and the second material to a plasma environment in the processing space, and
    performing a modulated plasma etching process to selectively remove the first material at a rate greater than removing the second material, the modulated plasma etching process including a modulation cycle that:
    preferentially reacts an etchant with the first material during a first phase of the modulation cycle, and
    differentially adheres a passivant on the second material relative to the first material during a second phase of the modulation cycle,
    wherein the modulated plasma etching process includes:
    introducing a process gas composition to the plasma processing system, the process composition including a $C_xH_yR_z$-containing gas, wherein R represents a halogen element, x and y represent a real number greater than 0, and z represents a real number greater than or equal to 0,
    igniting plasma using a plasma source,
    electrically biasing a substrate holder that supports the substrate with radio frequency (RF) power, and
    modulating the RF power for the electrical biasing between a first power state during the first phase of the modulation cycle and a second power state during a second phase of the modulation cycle.

11. The method of claim 10, further comprising:
    selecting a process condition for the modulated plasma etching process and controlling a profile of the pattern formed within the heterogeneous layer, the process condition including setting a pulse amplitude, a pulse frequency, a pulse duty cycle, or a pulse waveform, or any combination thereof.

12. The method of claim 11, wherein the process composition is continuously flowed into the plasma processing system during the pulsing.

13. The method of claim 10, wherein the modulating of RF power for the electrical biasing comprises pulsing the RF power between an off-state and an on-state.

14. The method of claim 13, further comprising:
    achieving an etch rate of the first domain that is at least 4 times greater than the etch rate of the second domain.

15. The method of claim 10, wherein the $C_xH_yR_z$-containing gas has a hydrogen-to-carbon ratio (H/C) greater than unity, and a hydrogen-to-halogen ratio (H/R) greater than or equal to unity.

16. The method of claim 10, wherein at least one constituent of the process composition is pulsed into the plasma processing system during the pulsing.

17. The method of claim 16, wherein the pulsed flow of the at least one constituent of the process composition is in-phase or out-of-phase with the pulsing the RF power.

18. The method of claim 10, wherein the modulating the RF power for the electrical biasing further comprises:
   pulsing the RF power at a first RF power level for a first time duration; and
   pulsing the RF power at a second RF power level for a second time duration, wherein the second RF power level is less than the first RF power level, and the second time duration follows the first time duration.

19. The method of claim 18, wherein the pulsing the RF power for the electrical biasing further comprises:
   pulsing the RF power at a third RF power level for a third time duration, wherein the third RF power level is less than the second RF power level, and the third time duration follows the second time duration.

20. The method of claim 18, wherein the pulsing the RF power for the electrical biasing further comprises:
   decreasing a RF power level for the pulsing the RF power.

21. The method of claim 18, wherein the pulsing the RF power for the electrical biasing further comprises:
   pulsing the RF power at a first RF power level for a first time duration;
   pulsing the RF power at a second RF power level for a second time duration, wherein the second RF power level is less than the first RF power level, and the second time duration follows the first time duration; and
   terminating the pulsing the RF power for a third time duration, the third time duration following the second time duration.

22. A method of patterning etching a layer on a substrate, comprising:
   disposing a substrate having a phase-separated block copolymer layer thereon in a plasma processing system; and
   selectively removing a first phase of the phase-separated block copolymer layer while retaining a second phase of the phase-separated block copolymer layer to form a pattern on the substrate by performing a pulsed etching process, the pulsed etching process comprising:
      introducing a process gas composition to the plasma processing system, the process composition including a $C_xH_yR_z$-containing gas, wherein R represents a halogen element, x and y represent a real number greater than 0, and z represents a real number greater than or equal to 0,
      igniting plasma using a plasma source,
      electrically biasing a substrate holder that supports the substrate with radio frequency (RF) power, and
      pulsing the RF power for the electrical biasing.

23. The method of claim 22, wherein the $C_xH_yR_z$-containing gas has a hydrogen-to-carbon ratio (H/C) greater than unity, and a hydrogen-to-halogen ration (H/R) greater than or equal to unity.

* * * * *